(12) United States Patent
Kusunoki

(10) Patent No.: US 6,393,259 B1
(45) Date of Patent: May 21, 2002

(54) AMPLIFIER CIRCUIT AND TRANSCEIVER

(75) Inventor: Shigeo Kusunoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/260,041

(22) Filed: Mar. 2, 1999

(30) Foreign Application Priority Data

Mar. 10, 1998 (JP) .......................................... 10-058136

(51) Int. Cl.[7] .............................. H04B 1/44; H04B 1/10; H03F 1/26; H03F 3/04
(52) U.S. Cl. ............................ 455/78; 455/296; 455/83; 330/149; 330/302
(58) Field of Search .......................... 455/78, 67.1, 295, 455/296, 80–83, 250.1, 254, 234.1; 375/295, 296; 333/139, 141, 144; 330/302, 149

(56) References Cited

U.S. PATENT DOCUMENTS

| | | | |
|---|---|---|---|
| 5,121,077 A | * | 6/1992 | McGann ..................... 330/149 |
| 5,528,196 A | * | 6/1996 | Baskin et al. ................ 330/151 |
| 5,742,201 A | * | 4/1998 | Eisenberg et al. ...... 330/149 X |
| 6,005,441 A | * | 12/1999 | Kawahara ................... 330/302 |
| 6,104,241 A | * | 8/2000 | Cova et al. ................. 330/149 |

* cited by examiner

Primary Examiner—Tracy Legree
(74) Attorney, Agent, or Firm—Jay H. Maioli

(57) ABSTRACT

In an amplifier circuit and a transceiver, inter-modulation distortion caused by a transmission signal (S17) leaking from a transmission circuit (11) is eliminated without increasing the current output from the output terminal of an amplification element. An adjustment circuit constituted by connecting a phase rotation element (SL) and a resistive element (Rf) in series is connected between the input terminal and the output terminal of the amplification element (Q) and the rotation angle of the phase rotation element and the resistance value of the resistive element are set to desired values respectively. Therefore, it is possible to reduce inter-modulation distortion while preventing current consumption from increasing and thus, to prevent the reception sensitivity from deteriorating without increasing power consumption.

10 Claims, 4 Drawing Sheets

AMPLIFIER CIRCUIT AND TRANSCEIVER

BACKGROUND OF THE INVENTION

1. Field of the Invention

The present invention relates to an amplifier circuit and a transceiver, and more particularly, is preferably applied to, for example, a portable telephone.

2. Description of the Related Art

A portable telephone system represented by a personal digital cellular (PDC) and a personal handyphone system (PHS) is widely used. Various systems are proposed as the communication systems of these types of portable telephones. The time-division multiple access (TDMA) system is a typical system.

The TDMA system realizes a plurality of communications (so-called multiplex communication) with channels having the same frequency by temporally dividing one frequency channel so as to efficiently use frequencies. A portable telephone using the TDMA system uses a time-division separation system referred to as a time division duplex (TDD) system as a system for separating a transmission signal from a reception signal in which transmission and reception are respectively performed in separate time.

Moreover, the code division multiple access (CDMA) system has been recently proposed as a communication system having a frequency utilization efficiency higher than that of the TDMA system. The CDMA system realizes multiplex communication with one frequency channel by assigning a different diffusion code to each user and by multiplying the diffusion code by transmission data.

In such a portable telephone using the CDMA system, an inter-modulation distortion that does not occur in the above TDD system may occur because transmission and reception are performed at the same time. The inter-modulation distortion occurs because a transmission signal leaks into a reception system and serves as an interference wave and it is mixed with an original reception signal. Hereafter, the occurrence theory of the inter-modulation distortion is specifically described below by referring to FIG. 1 showing an antenna peripheral circuit of a portable telephone.

In the portable telephone 1, a transmission signal S1 amplified by a transmission amplifier circuit 2 is supplied to an antenna 4 through a duplexer 3 at the time of transmission and a radio wave corresponding to the transmission signal S1 is emitted to the space by an antenna 4. On the other hand, at the time of reception, in the portable telephone 1, a reception signal S2 received by the antenna 4 is amplified by a reception amplifier circuit 5 through the duplexer 3 and thereafter, supplied to a demodulation circuit (not illustrated) and etc. at the rear stage.

In this case, the duplexer 3 serves as a circuit for separating the transmission signal Si from the reception signal S2. However, because a transmission power is usually much larger than a reception power, the separation by the duplexer 3 cannot be completely performed and thereby, the transmission signal S1 may leak into a reception system. When the transmission signal S1 leaking into the reception system and the reception signal S2 received by the antenna 4 are inputted to the reception amplifier circuit 5, an inter-modulation distortion occurs due to the nonlinear characteristic of the reception amplifier circuit 5. When the transmission signal S1 serving as an interference wave has a frequency equal to the frequency of the reception signal S2 being a desired wave, the inter-modulation distortion serves as an interference wave to deteriorate the signal-to-noise ratio (S/N ratio). Consequently, the inter-modulation distortion deteriorates the reception sensitivity of the portable telephone 1.

To reduce the inter-modulation distortion, a method is considered which improves the separation degree of the duplexer 3 or the linearity of the reception amplifier circuit 5. When adopting either method, the size of a transistor or current consumption must be increased. Consequently, power consumption is increased.

To make it possible to use the portable telephone 1 driven by a battery for a long time, it is necessary to reduce the power consumption of the portable telephone 1. The above described reception amplifier circuit 5 is operated even under a standby state. Therefore, if the power consumption of the reception amplifier circuit 5 can be reduced, it may be possible to reduce the entire power consumption of the portable telephone 1. Therefore, in the reception amplifier circuit 5, it is preferable to minimize the power consumption even when an inter-modulation distortion is prevented.

In general, when the portable telephone 1 has a large transmission power and a small reception power, the reception sensitivity is deteriorated due to an inter-modulation distortion. Therefore, in the portable telephone, by increasing the current consumption of the reception amplifier circuit 5 only when an inter-modulation distortion influences the reception sensitivity, it may be possible to prevent the reception sensitivity from deteriorating while preventing the power consumption from increasing. In the above portable telephone, when, for example, the reception amplifier circuit 5 has a current consumption of 16 mA and an inter-modulation distortion of −104.6 dBm, the inter-modulation distortion becomes −119 dBm by increasing the current consumption to 54 mA and thus, it is possible to reduce the inter-modulation distortion by 14.4 dBm. However, even in this case, the current consumption is increased approx. three times. Consequently, such a problem occurs that the power consumption is increased to shorten the continuous working time of a battery.

SUMMARY OF THE INVENTION

In view of the foregoing, an object of this invention is to provide an amplifier circuit and a transceiver capable of preventing the reception sensitivity from deteriorating without increasing power consumption.

The foregoing object and other objects of the invention have been achieved by the provision of an amplifier circuit provided at the first stage of a reception circuit of a transceiver having a transmission circuit and the reception circuit. The reception circuit comprises an amplification element for amplifying a reception signal input through an input terminal and outputting it to an external unit from an output terminal, an adjustment circuit connected between the input terminal and output terminal of the amplification element and constituted by connecting a phase rotation element and a resistive element in series, and a load element connected to the output terminal of the amplification element, so as to eliminate an inter-modulation distortion caused by a transmission signal leaking from the transmission circuit, by setting the rotation angle of the phase rotation element and the resistance value of the resistive element to desired values.

By connecting the adjustment circuit, which is constituted by connecting a phase rotation element and a resistive element in series, between the input terminal and output terminal of an amplification element and by setting the rotation angle of the phase rotation element and the resistance value of the resistive element to desired values, it is possible to eliminate an inter-modulation distortion caused by a transmission signal leaking from a transmission circuit without increasing the current output from the output terminal of the amplification element and thereby, reduce the inter-modulation distortion while preventing current consumption from increasing.

Moreover, the present invention provides a transceiver comprising a transmission circuit and a reception circuit. The reception circuit is provided, at the first stage, with an amplification element for amplifying a reception signal input through an input terminal and outputting it to an external unit from an output terminal, an adjustment circuit connected between the input terminal and output terminal of the amplification element and constituted by connecting a phase rotation element and a resistive element in series, and a load element connected to the output terminal of the amplification element, and moreover provided with an amplifier circuit for eliminating an inter-modulation distortion caused by a transmission signal leaking from the transmission circuit by setting the rotation angle of the phase rotation element and the resistance value of the resistive element to desired values.

By connecting the adjustment circuit, which is constituted by connecting the phase rotation element and the resistive element in series, between the input terminal and output terminal of an amplification element and by setting the rotation angle of the phase rotation element and the resistance value of the resistive element to desired values, it is possible to eliminate an inter-modulation distortion caused by a transmission signal leaking from a transmission circuit without increasing the current output from the output terminal of the amplification element and thereby, reduce the inter-modulation distortion while preventing current consumption from increasing.

The nature, principle and utility of the invention will become more apparent from the following detailed description when read in conjunction with the accompanying drawings in which like parts are designated by like reference numerals or characters.

DETAILED DESCRIPTION OF THE PREFERRED EMBODIMENT

Figure 1:
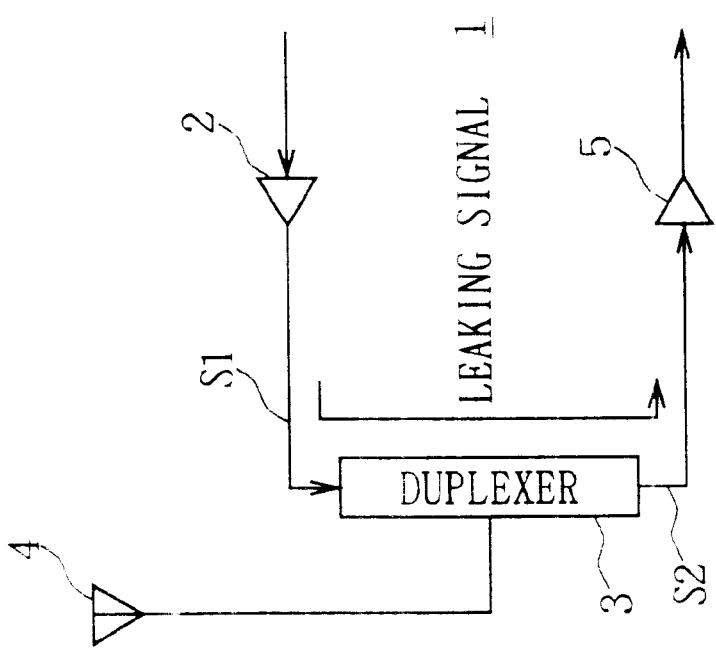
FIG. 1 is a block diagram showing the structure of an antenna peripheral circuit of a portable telephone.

Preferred embodiments of this invention will be described with reference to the accompanying drawings.

A portable telephone using the CDMA system may cause an inter-modulation distortion when performing transmission and reception at the same time. The occurrence theory of the inter-modulation distortion will be described below. In general, a portable telephone has a low-noise amplifier circuit (hereafter referred to as a reception amplifier circuit) at the first stage of a reception circuit and the reception amplifier circuit uses a field-effect transistor (hereafter referred to as FET). The nonlinear transfer function of the nonlinear element of the above FET is shown by the following Equation (1).

$$y = H1 \cdot x + H2 \cdot x^2 + H3 \cdot x^3 \tag{1}$$

In this case, symbol x denotes an input voltage and y denotes an output voltage. Moreover, symbols H1, H2, H3, . . . denote coefficients of nonlinear terms, which are respectively referred to as the core of Volterra series. The Volterra series is used when a nonlinear element includes a capacitor or the like and the nonlinearity of the element becomes a problem.

In this case, it is assumed that the portable telephone inputs, for example, a signal obtained by adding a reception signal serving as a desired wave and a transmission signal serving as an interference wave (amplitude-modulated wave), to the reception amplifier circuit as an input voltage. The signal obtained by adding the desired wave and the interference wave is shown by the following Equation (2).

$$x(t) = \frac{V}{2}\left[e^{j\omega l \cdot t} + \frac{b1}{2}\{e^{j(\omega l + \omega m)t} + e^{j(\omega l - \omega m)t}\} + e^{j\omega 2 \cdot t} + cc\right] \tag{2}$$

In this case, symbol V denotes an amplitude, b1 denotes the modulation factor of a transmission signal (amplitude-modulated signal), and CC denotes a complex conjugate. Moreover, symbol ω1 denotes the carrier angular frequency of an interference wave, ω2 denotes the carrier angular wave of a desired wave, and ωm denotes the angular frequency of an amplitude-modulated component of an interference wave.

Thus, a wave obtained by adding a desired wave and an interference wave is input to the reception amplifier circuit. Therefore, the output voltage y of the reception amplifier circuit is obtained from the following Equation (3) by substituting the above Equation (2) for the Equation (1) and moreover, setting the phases of H1, H2, . . . respectively serving as the core of the Volterra series to θ1, θ2, . . .

$$\begin{aligned}
y(t) &= V \cdot |H1|\cos(\omega 2 \cdot t + \theta 1) + \frac{3}{2}|H3| \cdot b1 \cdot \\
&\quad V^3 \cos(\omega 2 \cdot t + \theta 2)\cos(\omega m \cdot t) \\
&= V \cdot |H3| \cdot \sqrt{\{1 + 2 \cdot B \cdot \cos(\omega m \cdot t)\cos\varphi\}^2 + B^2 \cdot \sin^2(\varphi)} \times \\
&\quad \cos(\omega 2 \cdot t + \theta 2 + \zeta) \\
\varphi &= \theta 2 - \theta 1 \\
\zeta &= \tan^{-1}\left\{\frac{B \cdot \cos(\omega m)\sin(\varphi)}{1 + B \cdot \cos(\omega m)\cos(\varphi)}\right\} \\
B &= 3 \cdot b1 \frac{H3}{H1} \cdot V^2
\end{aligned} \tag{3}$$

From the above Equation (3), it is found that the amplitude of a reception signal serving as a desired wave is influenced by the value of the angular frequency ωm of the amplitude-modulated component of an interference wave. Because the angular frequency ωm of the amplitude-modulated component of the interference wave cannot be separated by a filter or the like, it serves as an inter-modulation distortion to deteriorate the reception sensitivity. Therefore, the portable telephone deteriorates the reception sensitivity because a transmission signal of the telephone serves as an interference wave.

When ψ is equal to 90[deg], the above Equation is shown as the following Equation (4).

$$y(t)_{\psi=0} = B \cdot h \sin(\psi) \cos(\omega 2 \cdot t + \theta 2 + \zeta) \quad (4)$$

Thus, it is found that the influence of the angular frequency ωm of the amplitude-modulated component of the interference wave has been eliminated. Because the value ψ is the difference between θ2 and θ1, it is possible to eliminate inter-modulation distortions by setting θ2 and θ1 to a proper value respectively and ψ to 90[deg]. These θ1 and θ2 depend on a parameter of a nonlinear element such as an FET. Therefore, by setting a feedback circuit to the outside of the FET and ψ to 90[deg], it is possible to realize a reception amplifier circuit preventing an inter-modulation distortion from occurring.

Figure 2:
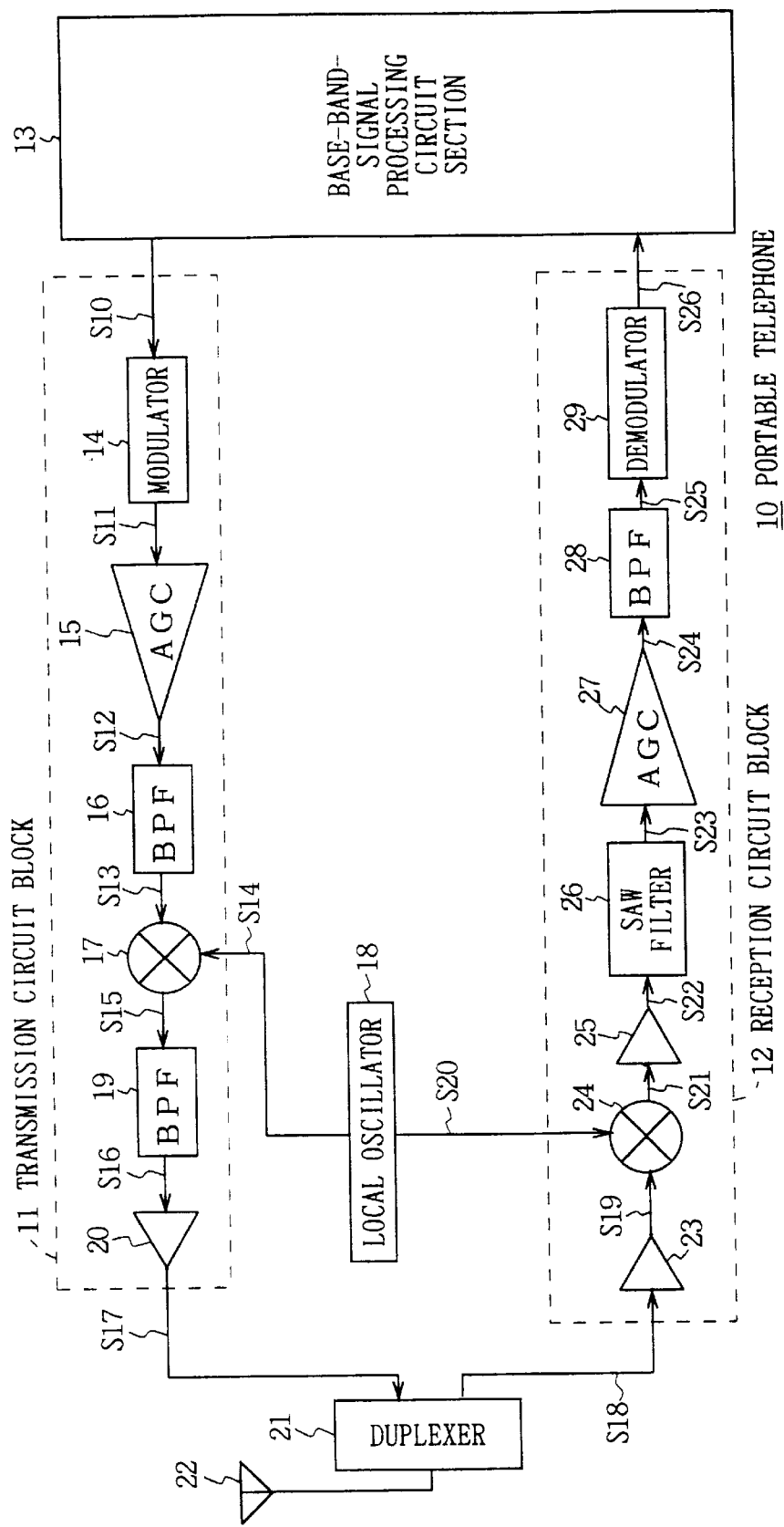
FIG. 2 is a block diagram showing the structure of the portable telephone of one embodiment of the present invention.

FIG. 2 shows the structure of a portable telephone 10. The portable telephone 10 is constituted with a transmission circuit block 11, a reception circuit block 12, and a base-band-signal processing circuit 13 for processing a base-band signal. Under transmission, the base-band-signal processing circuit 13 outputs a transmission base-band signal S10 generated by applying a predetermined signal processing to an audio signal input from a microphone (not illustrated), to a modulator 14. The modulator 14 modulates the transmission base-band signal S10 in accordance with, for example, four-phase-shift keying and outputs the resultant transmission intermediate-frequency signal S11 to a variable amplifier circuit (hereafter referred to as AGC) 15.

The AGC 15 amplifies the transmission intermediate-frequency signal S11 up to a desired level and outputs the resultant transmission intermediate-frequency signal S12 to a band-pass filter 16. The band-pass filter 16 eliminates out-of-band unnecessary components and noises from the transmission intermediate-frequency signal S12 and outputs the resultant transmission intermediate-frequency signal S13 to a mixer 17. The mixer 17 performs frequency conversion by multiplying the transmission intermediate-frequency signal S13 by a local-frequency signal S14 supplied from a local oscillator 18 and outputs the resultant transmission high-frequency signal S15 to a band-pass filter 19.

The band-pass filter 19 eliminates out-of-band unnecessary components and noises from the transmission high-frequency signal S15 and outputs the resultant transmission high-frequency signal S16 to a transmission amplifier circuit 20. The transmission amplifier circuit 20 amplifies the transmission high-frequency signal S16 and supplies the resultant transmission signal S17 to an antenna 22 through a duplexer 21 serving as a signal separation circuit. Thereby, the transmission signal S17 is transmitted from the antenna 22.

Under reception, however, a reception signal S18 received by the antenna 22 is separated through the duplexer 21 and thereafter, is input to a reception amplifier circuit 23 provided for the first stage of the reception circuit block 12. The reception amplifier circuit 23 amplifies the reception signal S18 and outputs the resultant reception high-frequency signal S19 to a mixer 24.

The mixer 24 performs frequency conversion by multiplying the reception high-frequency signal S19 by a local-frequency signal S20 supplied from the local oscillator 18 and outputs the resultant reception intermediate-frequency signal S21 to an amplifier circuit 25. The amplifier circuit 25 amplifies the reception intermediate-frequency signal S21 and outputs the resultant reception intermediate-frequency signal S22 to a surface acoustic wave (SAW) filter 26. The SAW filter 26 eliminates out-of-band unnecessary components and noises from the reception intermediate-frequency signal S22 and outputs the resultant reception intermediate-frequency signal S23 to an AGC 27.

The AGC 27 amplifies the reception intermediate-frequency signal S23 up to a desired level and outputs the resultant reception intermediate-frequency signal S24 to a band-pass filter 28. The band-pass filter 28 eliminates out-of-band unnecessary components and noises from the reception intermediate-frequency signal S24 and outputs the resultant reception intermediate-frequency signal S25 to a demodulator 29. The demodulator 29 demodulates the reception intermediate-frequency signal S25 in accordance with, for example, the synchronous-detection-type demodulation system and outputs the resultant reception base-band signal S26 to a base-band-signal processing circuit section 13. The base-band-signal processing circuit section 13 reproduces an audio signal by applying a predetermined signal processing to the reception base-band signal S26 and outputs the audio signal to a loudspeaker (not illustrated).

Figure 3:
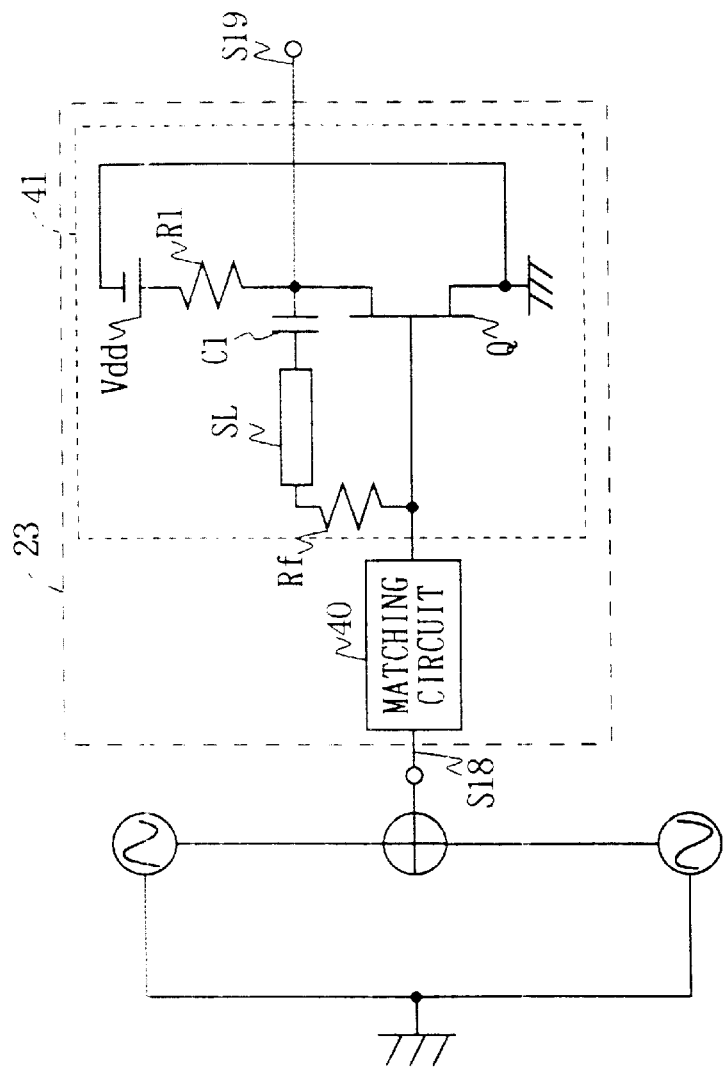
FIG. 3 is a block diagram showing the structure of a reception amplifier circuit.

A specific structure of the reception amplifier circuit 23 will be described below by referring to FIG. 3. To understandably explain the theory for an inter-modulation distortion to occur, FIG. 3 shows a state in which the reception signal S18 obtained by adding a signal leaking from the transmission circuit block 11 to the reception signal S18 received by the antenna 22 is input to the reception amplifier circuit 23. The reception amplifier circuit 23 is constituted with a matching circuit 40 and an amplifier 41 so as to input the reception signal S18 added with a leaking signal to the amplifier 41 through the matching circuit 40 and amplify the reception signal S18 by the amplifier 41. In this connection, the matching circuit 40 is provided so as to minimize noises.

The amplifier 41 is constituted so as to input the reception signal S18 to the gate of an FETQ. A series circuit constituted with a resistance Rf, a microstrip line SL, and a capacitor C1 is connected between the gate and drain of the FETQ. In this case, the resistance Rf is constituted so that its resistance value can be adjusted. Moreover, the microstrip line SL is constituted so that the rotation angle of a phase can be adjusted by adjusting the length of the line SL. The capacitor C1 prevents DC components and passes high-frequency components without attenuating them. Furthermore, the drain of the FETQ connects with the anode of a power supply Vdd through a resistance R1 and the cathode of the power supply Vdd connects with an earth line GND. Furthermore, the source of the FETQ is connected to the earth line GND.

The reception amplifier circuit 23 is constituted so as to change inter-modulation distortion levels and amplification degrees by adjusting the resistance value of the resistance Rf and the length of the microstrip line SL, that is, the rotation angle. First, FIG. 4 shows the relation between the inter-modulation distortion level CM and the power converted value Fnd (hereafter referred to as signal output) of the reception signal S18 amplified by the FETQ when fixing the resistance Rf to 60[Ω] and changing the rotation angle γ of the microstrip line SL.

Figure 4:
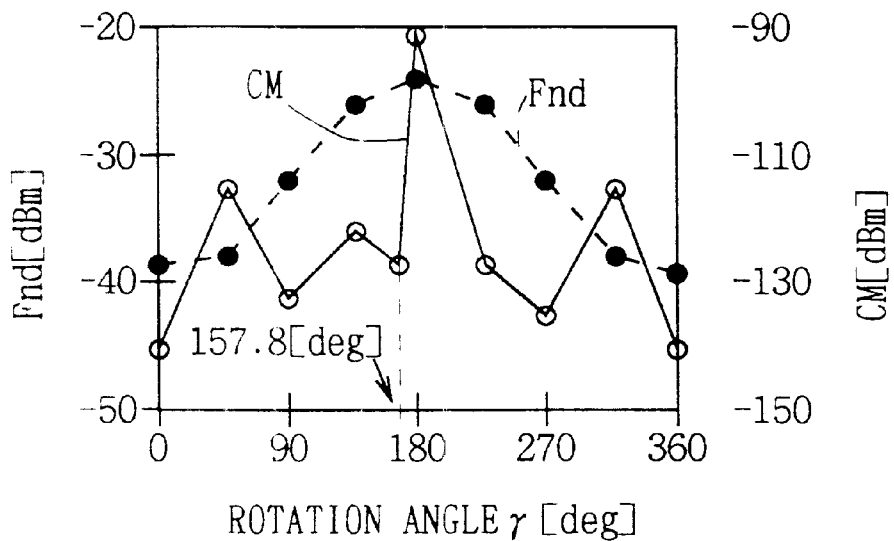
FIG. 4 is a diagram showing the relation between the phase rotation angle and the inter-modulation distortion level.

As shown in FIG. 4, by fixing the resistance Rf to 60[Ω] and changing rotation angles of the microstrip line SL, the amplifier 41 shows a tendency in which the signal output Fnd decreases when the inter-modulation distortion level CM lowers and the signal output Fnd increases when the inter-modulation distortion level CM rises. Therefore, in the amplifier 41, it is necessary to minimize the deterioration of the signal output Fnd and set the inter-modulation distortion level CM as low as possible. It is found that the microstrip line SL when minimizing the deterioration of the signal output Fnd and setting the inter-modulation distortion level CM as low as possible has a rotation angle of 157.8[deg].

Figure 5:
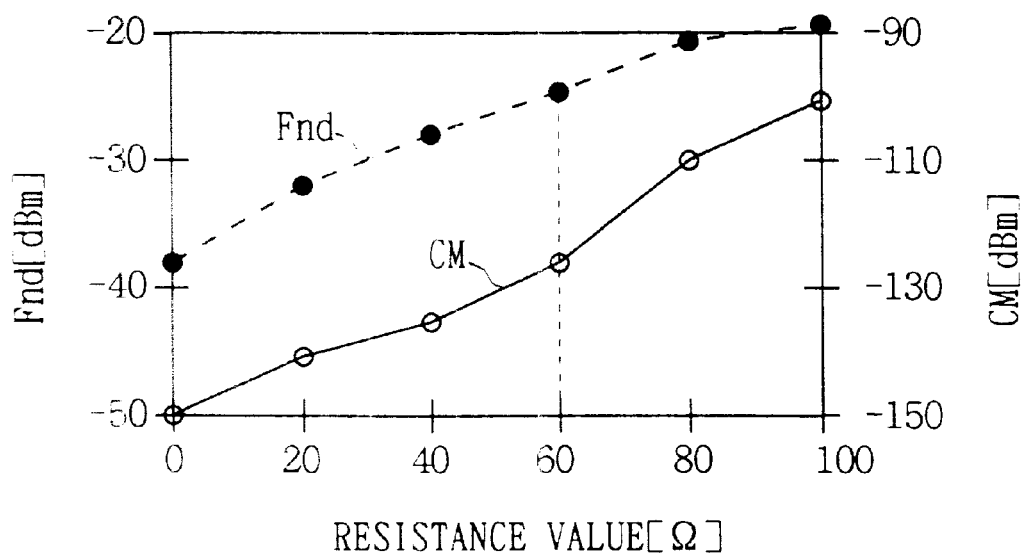
FIG. 5 is a diagram showing the relation between the resistance value and the inter-modulation distortion level.

FIG. 5 shows the relation between the inter-modulation distortion level CM and the signal output Fnd when fixing the rotation angle of the microstrip line SL to 157.8[deg] and changing the resistance Rf. As shown in FIG. 5, by fixing the rotation angle of the microstrip line SL to 157.8[deg] and changing the resistance Rf, the amplifier 41 shows a remarkable tendency in which the signal output Fnd decreases when the inter-modulation distortion level CM lowers and the signal output Fnd increases when the inter-modulation distortion level CM rises. Therefore, in the amplifier 41, it is necessary to minimize the deterioration of the signal output Fnd and simultaneously minimize the inter-modulation distortion level CM. It is found that the resistance Rf when minimizing the deterioration of the signal output Fnd and setting the inter-modulation distortion level CM as low as possible has a resistance value of 60 [Ω].

In a conventional reception amplifier circuit, when a drain current is 16[mA], the inter-modulation distortion level is −104.6[dBm]. However, in the above reception amplifier circuit 23, when setting the rotation angle of the microstrip line SL to 157.8[deg] and the resistance Rf to 60[Ω], it is found that the inter-modulation distortion level becomes −124.1[dBm] and the inter-modulation distortion level can be decreased by 19.5[dBm].

In the reception amplifier circuit 23 having the above structure, a series circuit constituted with the resistance Rf, microstrip line SL, and capacitor C1 is connected between the gate and drain of the FETQ. The reception amplifier circuit 23 makes it possible to eliminate inter-modulation distortions caused by the transmission signal S17 leaking into a reception system by only setting the value of the resistance Rf and the rotation angle of the microstrip line SL to desired values respectively. Therefore, it is possible to reduce inter-modulation distortions without increasing the drain current of the FETQ.

According to the above described structure, it is possible to eliminate inter-modulation distortions caused by the transmission signal S17 leaking into a reception system without increasing the drain current of the FETQ by connecting a series circuit constituted with the resistance Rf, microstrip line SL, and capacitor C1 between the gate and drain of the FETQ and moreover setting the value of the resistance Rf and the rotation angle of the microstrip line SL to desired values respectively. Therefore, it is possible to reduce inter-modulation distortions while preventing current consumption from increasing and thus, prevent the reception sensitivity from deteriorating without increasing power consumption.

For the above described embodiment, the reception signal S18 is amplified by an FETQ. However, the present invention is not restricted to the above case. It is also possible to apply various amplification elements including a bipolar transistor as long as the elements are low-noise amplification elements. In short, by using an amplification element for amplifying the reception signal S18 input through an input terminal and outputting it from an output terminal, it is possible to obtain the same advantage as the above case.

Moreover, for the above described embodiment, the resistance R1 is connected between the drain of an FETQ and the power supply Vdd. However, the present invention is not restricted to the above case. By connecting various load elements like a matching circuit or coil in order to improve a gain, it is possible to obtain the same advantage as the above case.

Furthermore, for the above described embodiment, the rotation angle of a phase is adjusted by the microstrip line SL. However, the present invention is not restricted to the above case. It is also possible to obtain the same advantage as the above case by adjusting a rotation angle with various phase rotation elements like a coil, a capacitor, or a phase-shifting circuit consisting of a coil and a capacitor.

Furthermore, for the above described embodiment, the present invention is applied to a CDMA-type portable telephone. However, the present invention is not restricted to the above case. It is also possible to widely apply the present invention to a portable telephone using a communication system of simultaneously performing transmission and reception.

Furthermore, for the above described embodiment, the present invention is applied to a portable telephone. However, the present invention is not restricted to the above case. It is also possible to obtain the same advantage as the above case by applying the present invention to a radio-communication terminal unit having various transmission-reception functions like a PHS.

Furthermore, for the above described embodiment, the present invention is applied to a radio-communication terminal unit. However, the present invention is not restricted to the above case. It is possible to obtain the same advantage as the above case by applying the present invention to various transceivers including a transceiver for performing transmission and reception through a cable transmission line such as a coaxial cable.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. An amplifier circuit provided for a first stage of a reception circuit of a transceiver also having a transmission circuit, comprising:
   an amplification element for amplifying a reception signal input through an input terminal and for outputting said reception signal from an output terminal;
   an adjustment circuit connected between said input terminal and said output terminal of said amplification element and having a phase rotation element, a capacitance element, and a resistive element connected in series, wherein the capacitance element blocks DC components and passes high-frequency components; and
   a load element connected between said output terminal of said amplification element and a power supply, wherein a rotation angle of said phase rotation element and a resistance value of said resistive element are set to predetermined values, respectively, to eliminate inter-modulation distortion caused by a transmission signal leaking from said transmission circuit.

2. The amplifier circuit according to claim 1, wherein said phase rotation element comprises a microstrip line.

3. The amplifier circuit according to claim 1, wherein said phase rotation element comprises a coil.

4. The amplifier circuit according to claim 1, wherein said load element comprises a matching circuit.

5. The amplifier circuit according to claim 1, wherein said load element comprises a coil.

6. A transceiver comprising a transmission circuit and a reception circuit, wherein
   a first stage of said reception circuit comprises:
   an amplification element for amplifying a reception signal input through an input terminal and for outputting said reception signal to an external unit from an output terminal;

an adjustment circuit connected between said input terminal and said output terminal of said amplification element and having a phase rotation element, a capacitance element, and a resistive element connected in series, wherein the capacitance element blocks DC components and passes high-frequency components; and a load element connected to said output terminal of said amplification element; and further comprising an amplifier circuit for setting a rotation angle of said phase rotation element and a resistance value of said resistive element to predetermined values, respectively, to eliminate inter-modulation distortion caused by a transmission signal leaking from said transmission circuit.

7. The transceiver according to claim 6, wherein said phase rotation element comprises a microstrip line.

8. The transceiver according to claim 6, wherein said phase rotation element comprises a coil.

9. The transceiver according to claim 6, wherein said load element comprises a matching circuit.

10. The transceiver according to claim 6, wherein said load element comprises a coil.

* * * * *